US011114396B2

(12) United States Patent
Zhao et al.

(10) Patent No.: US 11,114,396 B2
(45) Date of Patent: Sep. 7, 2021

(54) REDUCED-LENGTH BOND PADS FOR BROADBAND POWER AMPLIFIERS

(71) Applicant: Cree, Inc., Durham, NC (US)

(72) Inventors: Lei Zhao, Chandler, AZ (US); Mario Bokatius, Chandler, AZ (US)

(73) Assignee: Cree, Inc., Durham, NC (US)

( * ) Notice: Subject to any disclaimer, the term of this patent is extended or adjusted under 35 U.S.C. 154(b) by 71 days.

(21) Appl. No.: 16/418,361

(22) Filed: May 21, 2019

(65) Prior Publication Data

US 2020/0373265 A1    Nov. 26, 2020

(51) Int. Cl.
| | |
|---|---|
| *H03F 3/68* | (2006.01) |
| *H01L 23/00* | (2006.01) |
| *H01L 27/088* | (2006.01) |
| *H01L 25/065* | (2006.01) |
| *H03F 1/02* | (2006.01) |
| *H01L 23/66* | (2006.01) |
| *H01L 25/00* | (2006.01) |
| *H03F 3/213* | (2006.01) |
| *H03F 1/56* | (2006.01) |
| *H01L 29/417* | (2006.01) |

(52) U.S. Cl.
CPC ............ *H01L 24/05* (2013.01); *H01L 23/66* (2013.01); *H01L 24/48* (2013.01); *H01L 24/49* (2013.01); *H01L 24/83* (2013.01); *H01L 25/0655* (2013.01); *H01L 25/50* (2013.01); *H01L 27/088* (2013.01); *H01L 29/41758* (2013.01); *H03F 1/0288* (2013.01); *H03F 1/56* (2013.01); *H03F 3/213* (2013.01); *H01L 2223/6611* (2013.01); *H01L 2223/6627* (2013.01); *H01L 2223/6655* (2013.01); *H01L 2224/04042* (2013.01); *H01L 2224/05552* (2013.01); *H01L 2224/48091* (2013.01); *H01L 2224/48227* (2013.01); *H01L 2224/49176* (2013.01); *H01L 2924/1903* (2013.01); *H01L 2924/19051* (2013.01); *H03F 2200/387* (2013.01); *H03F 2200/451* (2013.01)

(58) Field of Classification Search
CPC .......... H03F 1/56; H03F 3/213; H03F 1/0288; H03F 2200/387
USPC .................... 330/277, 295, 124 R, 307, 302
See application file for complete search history.

(56) References Cited

U.S. PATENT DOCUMENTS

2005/0127399 A1\*  6/2005  Meadows  ........... H01L 27/0605
                                                          257/194

\* cited by examiner

*Primary Examiner* — Khanh V Nguyen
*Assistant Examiner* — Khiem D Nguyen
(74) *Attorney, Agent, or Firm* — Coats & Bennett, PLLC (57) ABSTRACT

In a transistor formed on a semiconductor die mounted on a substrate, where the transistor output is connected to a circuit on the substrate, a bond pad electrically connected to a transistor drain finger manifold extends less than the full length of the manifold. By controlling the length of the bond pad, the parasitic capacitance it contributes may be controlled. In applications such as a Doherty amplifier, this parasitic capacitance forms part of the quarter-wave transmission line of an impedance inverter, and hence directly impacts amplifier performance. In particular, by reducing the parasitic capacitance contribution from transistor output bond pads, the bandwidth of a Doherty amplifier circuit may be improved. At GHz frequencies and with state of the art transistor device feature sizes, concerns about phase mismatch between drain finger outputs are largely moot.

12 Claims, 6 Drawing Sheets

REDUCED-LENGTH BOND PADS FOR BROADBAND POWER AMPLIFIERS

FIELD OF INVENTION

The present invention relates generally to semiconductor amplifiers, and in particular to a reduced-length bond pad for connecting a drain finger manifold of a transistor to circuits on a substrate, the length of the bond pad selected to control a parasitic capacitance.

BACKGROUND

Modern wireless communication networks operate by transmitting voice and data content modulated onto Radio Frequency (RF) signals, generally between fixed access points (known as base stations, eNB, gNB, etc.) and a large number of mobile terminals (User Equipment or UE, tablets, laptops, etc.). Signal transmissions in both directions require RF power amplifiers. Efficiency (output power divided by DC power) is an important consideration in both cases. Efficient power amplifiers are desired at access points because inefficient amplifiers simply turn much of the power consumed into heat, raising operating costs and requiring physical designs to release the heat. The power amplifier in a mobile terminal is a major consumer of battery power, and high efficiency is desired to extend the useful device lifetime per charge.

Amplifiers operate most efficiently at or near compression—the point at which an amplifier is always ON, or strongly conducting. An amplifier operating below its compression point operates in a linear range—the output signal is an amplified version of the input signal. Amplifiers that operate partially or totally in compression can transmit frequency/phase modulated signals, or On-Off Keying modulated signals (e.g., Morse code), at high power with high efficiency. In these applications, linearity is not required—that is, the amplifier may distort the signal amplitude without affecting the information modulated onto the signal. However, communication signals that encode information, even in part, by modulating the amplitude of a carrier signal require power amplifiers to operate with high linearity, to preserve the AM information.

Many of the signal modulation schemes standardized for use in modern wireless communication networks, such as for example, the various levels of Quadrature Amplitude Modulation (16-QAM, 64-QAM, 256-QAM), require a linear amplifier to avoid loss of amplitude-modulated information that would occur if the amplifier ran in compression. A characteristic of many such signals is that the average signal power is relatively low, but intermittent peaks in the signal have high power, compared to the average. This characteristic is quantified as the Peak to Average Power Ratio (PAPR). A single power amplifier transmitting a high-PAPR signal exhibits low efficiency, as it must be sized for signal peaks, which occur infrequently, and on average it runs at very low power. That is, the power amplifier must be designed with a large "headroom" that, on average, is not used. Since the operating point of the amplifier is far below its compression point, efficiency is poor. This means much of the power it consumes (from a battery in the case of a mobile terminal) is wasted as heat.

William Doherty solved this problem in 1936, designing a power amplifier having improved efficiency while transmitting high-PAPR AM radio signals. An RF Doherty amplifier 10, represented in block diagram form in FIG. 1, comprises a first transistor 18a used for most signal amplification, often referred to as a "main" or "carrier" amplifier stage, and a second transistor 18b used to amplify signal peaks, often referred to as an "auxiliary" or "peak" amplifier stage. The more general terms "first" and "second" transistor are used herein. A class-AB biased amplifier is often used for the first amplifier stage, which can be biased to amplify the average signal within a linear range, but close to compression (i.e., with low headroom). Signal peaks are amplified by, e.g., a class-C biased amplifier as the second amplifier stage, which is inactive most of the time, and only needs to be linear over a small portion of the input signal conduction angle.

Figure 1:
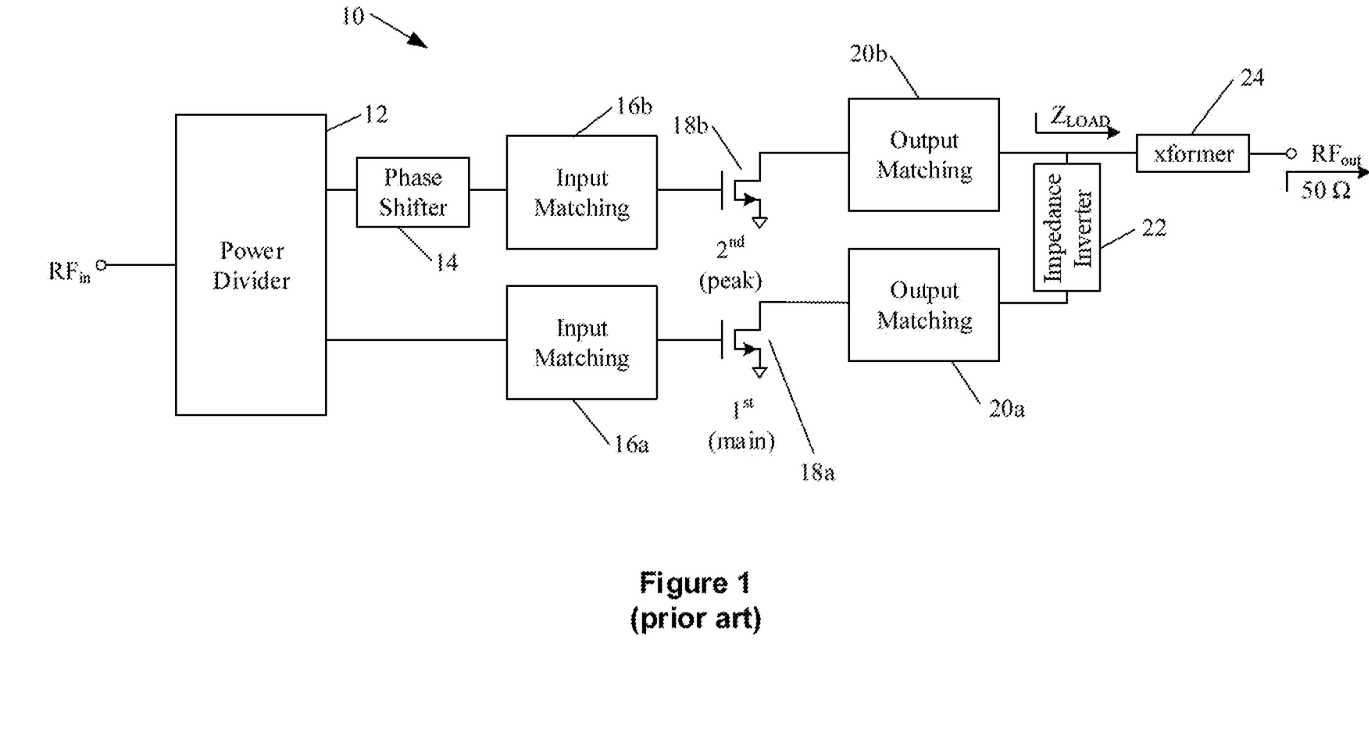
FIG. 1 is a block diagram of a representative, conventional Doherty amplifier circuit.

A feature of the Doherty amplifier is the output connection of the first 18a and second 18b transistors, which is made through an impedance inverter 22, often implemented using a quarter-wavelength transmission line, and often having a 90-degree phase shift. At low input signal power levels, the second transistor 18b is inactive, and is effectively an open circuit. The system impedance (e.g., 50Ω) is reduced at the output of the second transistor 18b due to the output matching network 24. This impedance is inverted to a much higher impedance by the impedance inverter 22, presenting a high output impedance to the first transistor 18a, improving its efficiency. As the second transistor 18b begins to amplify signal peaks, its increasing output current (summed with the output current of the first transistor 18a) increases the voltage across the load impedance, which the impedance inverter 22 presents to the first transistor 18a as a decreasing impedance. The lower impedance allows the first transistor 18a output power to increase as the input signal power increases. This is known as load modulation, and it results in the Doherty amplifier 10 exhibiting high efficiency across the full range of input signal power.

Stated differently, load modulation occurs because the output voltage of the Doherty amplifier 10 is determined by the summation of the first 18a second 18b transistor output currents, multiplied by the load impedance. Accordingly, the output impedance of the first transistor 18a is varied by the load current delivered by the second transistor 18b.

Note that, although the impedance inverter 22 often implements a 90-degree phase shift, this is not necessarily a requirement to obtain the load modulation of a Doherty amplifier. For example, a phase lag other than 90 degrees may be introduced in, e.g., the second transistor 18b path, and the impedance inverter 22 introduces a corresponding phase shift, such that the overall phase difference between the two transistor 18a, 18b paths is at or near 90 degrees.

Referring to FIG. 1, a power divider circuit 12 divides an RF input signal between the first 18a and second 18b transistors in response to its instantaneous power level. A phase shifter 14 delays the phase of the second transistor 18b input by matching the delay which the output impedance inverter 22 applies to the output of the first transistor 18a, which is often 90 degrees. In some embodiments, the power divider 12 and phase shifter 14 may be combined in a quadrature power divider, which both splits the input signal and applies a 90 degree phase shift to the second transistor 18b input. Input matching circuits 16a, 16b perform impedance matching, e.g., matching a standard 50Ω system impedance to the low input impedances of the first 18a and second 18b transistors. Similarly, output impedance matching circuits 20a, 20b match the low output impedance of transistors 18a, 18b to a standard system impedance, such as 50Ω.

As described above, the outputs of the first 18a and second 18b transistors in a Doherty configuration 10 are connected by an impedance inverter 22 having a 90 degree phase delay. The impedance inverter 22 is often implemented using a quarter-wavelength transmission line. The output of the Doherty amplifier 10 is taken at a so-called summing node, typically on the second transistor 18b side of the impedance inverter 22. An impedance transformer 24 transforms the load impedance $Z_{load}$ seen by the Doherty amplifier circuit 10 to the standard 50Ω system impedance.

Figure 2A:
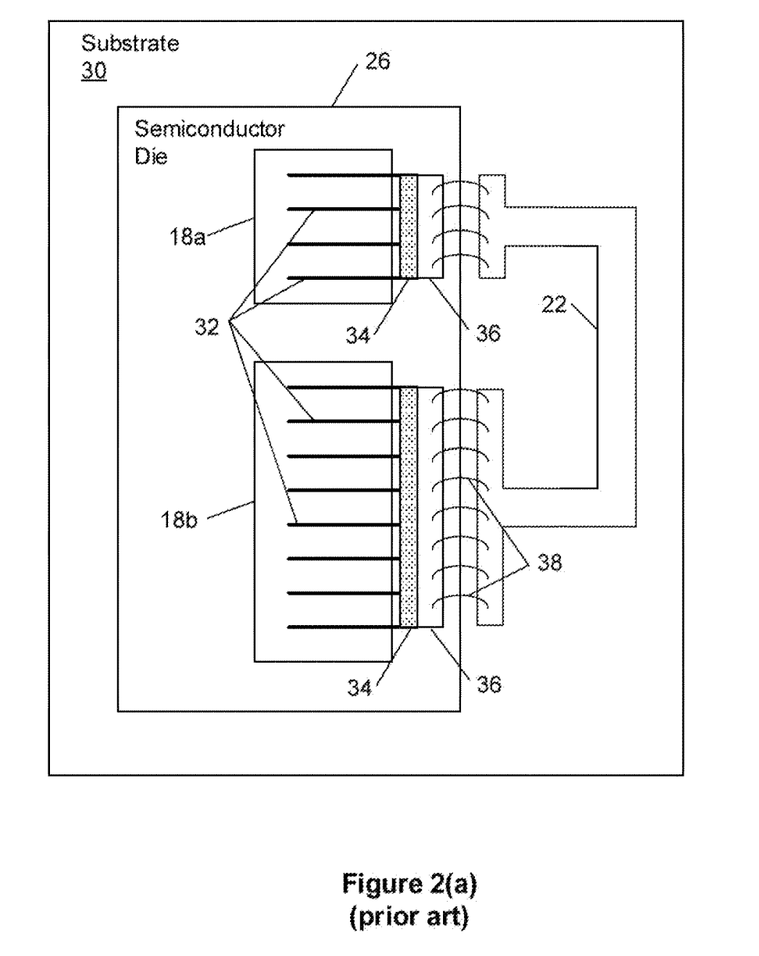
FIG. 2(a) is a diagram of a semiconductor die containing two transistors, bonded to a substrate, wherein bond pads on the transistors are coextensive with drain finger manifolds.
Figure 2B:
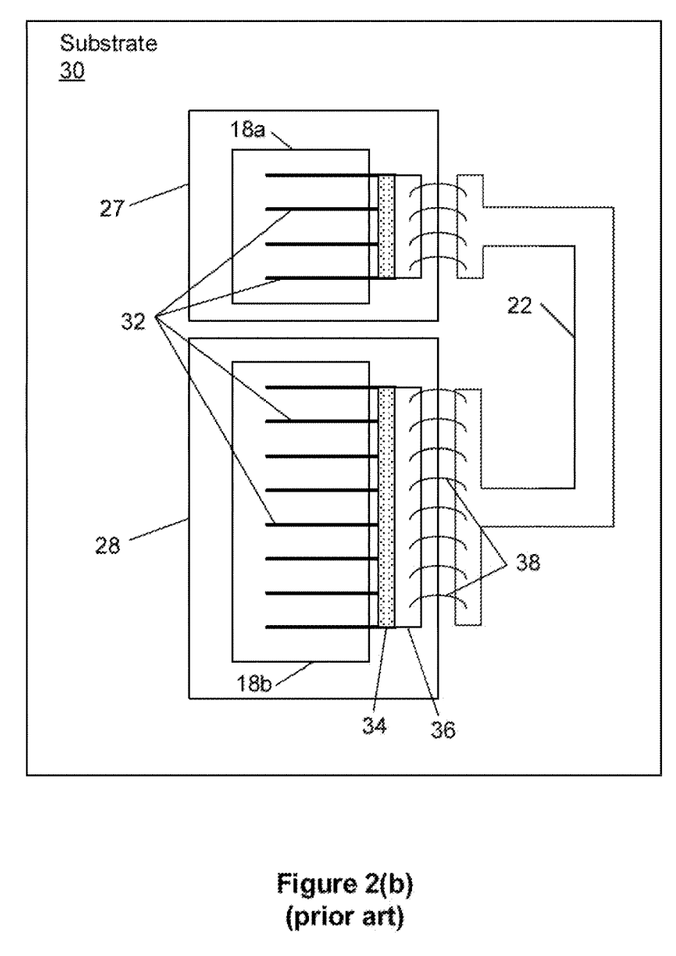
FIG. 2(b) is a diagram of a two semiconductor dice, each containing one transistor, bonded to a substrate, wherein bond pads on the transistors are coextensive with drain finger manifolds.

In many applications, the first and second transistors 18a, 18b may be formed together on a semiconductor die 26, as depicted in FIG. 2(a)—or each may be formed on a separate semiconductor die 27, 28, as depicted in FIG. 2(b)—which die or dice 26, 27, 28 are then bonded to a substrate 30. The connection between the transistors 18a, 18b outputs, i.e., via an impedance inverter 22, as well as any output matching circuits 20a, 20b and impedance transformer 24 (not shown), is formed on the substrate 30, which may for example comprise a Multi-Chip Module (MCM), or a Printed Circuit Board (PCB) including other RF circuitry.

To accommodate the relatively high current output by a power amplifier transistor 18a, 18b, the drain node typically comprises a plurality of drain "fingers," 32 or parallel contacts to the transistor drain structure. These fingers 32 are connected via a manifold 34, which is a metallization structure connecting all of the parallel drain fingers 32 for a given transistor 18a, 18b. Bond pads 36 are formed over the entire length of the manifolds 34, providing a landing area for wire bonds 38 connecting the transistor 18a, 18b drain terminals to the impedance inverter 22 on the substrate 30. In the prior art, the bond pads 36 on the die 26 (FIG. 2(a)) or dice 27, 28 (FIG. 2(b)) extend the entire length of the corresponding manifold 34. This is to equalize the electrical length of signals output by each drain finger 32. That is, if bond pad 36 covered only a part of the manifold 34, an output signal from a distant drain finger 32, not adjacent to the bond pad 36, would have the additional electrical path length of part of the manifold 34 to travel down, before connecting to the bond pad 36. This additional path length may alter the phase of that signal, as compared to one output by a drain finger 32 connecting to the manifold 34 where it is adjacent the bond pad 36. Additionally, extending the bond pads 36 along the entire length of the manifolds 34 provides the greatest area for connection of wire bonds 38 to the substrate 30.

However, conventional bond pads 36 have a large area which collects charge, and hence are a significant source of parasitic capacitance—for example, in the range of 0.4-2 pF for compact FET amplifiers—which limits the broadband performance of a Doherty amplifier 10.

The Background section of this document is provided to place embodiments of the present invention in technological and operational context, to assist those of skill in the art in understanding their scope and utility. Approaches described in the Background section could be pursued, but are not necessarily approaches that have been previously conceived or pursued. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

According to one or more embodiments described and claimed herein, the bond pad electrically connected to a transistor drain finger manifold extends less than the full length of the manifold. By controlling the length of the bond pad, the parasitic capacitance it contributes may be controlled. In applications such as a Doherty amplifier, this parasitic capacitance forms part of the, e.g., quarter-wave transmission line of an impedance inverter, and hence directly impacts amplifier performance. In particular, by reducing the parasitic capacitance contribution from transistor output bond pads, the bandwidth of a Doherty amplifier circuit may be improved. At GHz frequencies and with state of the art transistor device feature sizes, concerns about phase mismatch between drain finger outputs are largely moot.

One embodiment relates to an amplifier. The amplifier includes a substrate and at least a first semiconductor die mounted on the substrate. At least a first transistor is formed on the first semiconductor die. The first transistor includes a first plurality of drain fingers; a first manifold electrically connecting the first plurality of drain fingers; and a first bond pad electrically connected to the first manifold. The first bond pad extends a length less than the length of the first manifold. The amplifier further included at least one bond wire electrically connecting the first bond pad to a circuit on the substrate.

Another embodiment relates to a method of manufacturing an amplifier. A substrate is provided. At least a first semiconductor die is mounted on the substrate. The first semiconductor die has at least a first transistor formed thereon. The first transistor includes a first plurality of drain fingers; a first manifold electrically connecting the first plurality of drain fingers; and a first bond pad electrically connected to the first manifold. The first bond pad extends a length less than the length of the first manifold. The first bond pad is electrically connected to a circuit on the substrate via at least one bond wire.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

Figure 3:
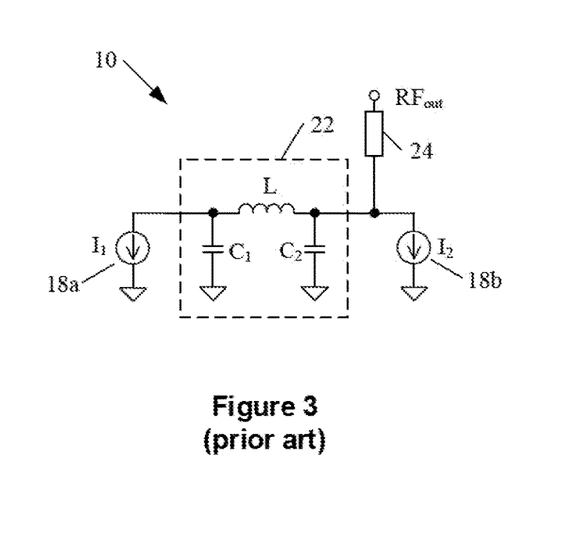
FIG. 3 is an equivalent circuit schematic representation of the transmission line of a Doherty amplifier impedance inverter.

FIG. 3 is an equivalent circuit schematic of key elements of the Doherty amplifier circuit of FIG. 1. The first 18a and second 18b amplifiers are modeled as current sources, and the impedance inverter 22, which may be implemented as a quarter-wave transmission line, is modeled as a pi-network, using lumped capacitances C1 and C2, and lumped inductance L. As used herein, a "lumped" component represents spatially distributed electrical and physical circuit effects as one (or two, when associated with separate amplifiers 18a, 18b) electrical components, such as a resistor, capacitor, inductor, or the like. Such lumping of circuit effects greatly simplifies simulation, and is reasonably accurate over at least some range of operating conditions (power, frequency, etc.). At least some of the lumped inductance L and capacitances C1 and C2 represent parasitic effects. For example, the bond wires 38 contribute to the inductance L. The lumped capacitances C1 and C2 comprise primarily the source to drain capacitances $C_{DS}$ of the transistor devices 18a, 18b, but also include parasitic capacitance contributed by the large areas of the bonding pads 36. This parasitic capacitance limits the broadband performance of the Doherty amplifier 10.

According to embodiments of the present invention, the sizes of bond pads connecting to the drain finger manifolds of the first and second transistors are varied, at least in part to control the parasitic capacitance contributed by the bond pads. In this manner, designers can control the resulting capacitances, and utilize them in the design of the quarter-wavelength impedance inverter to optimize the Doherty amplifier's wideband performance.

Figure 4A:
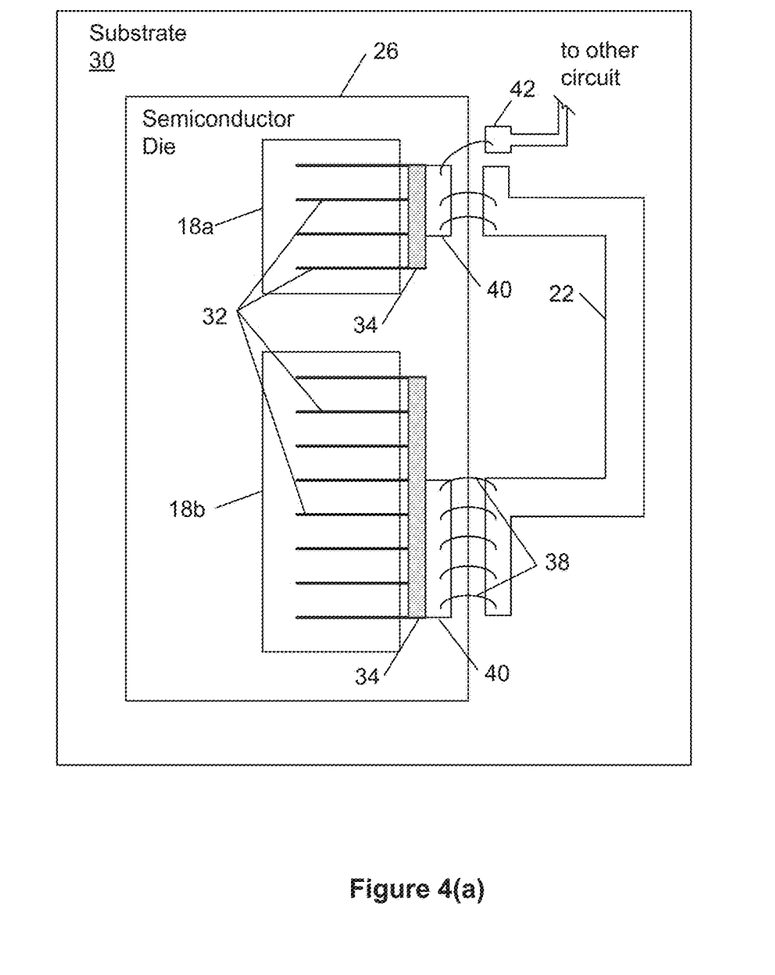
FIG. 4(a) is a diagram of a semiconductor die containing two transistors, bonded to a substrate, wherein bond pads on the transistors are shorter than the drain finger manifolds.
Figure 4B:
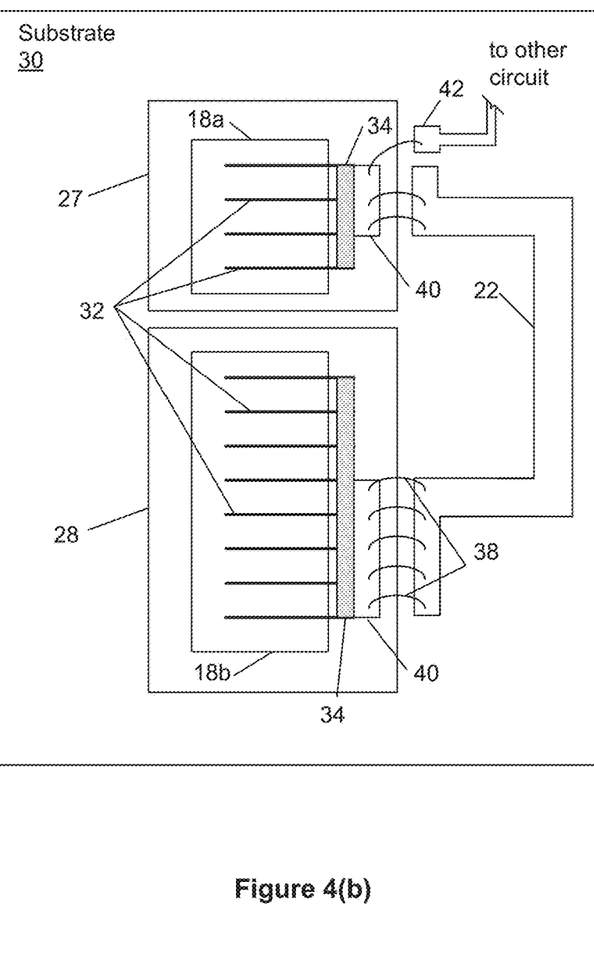
FIG. 4(b) is a diagram of a two semiconductor dice, each containing one transistor, bonded to a substrate, wherein bond pads on the transistors are shorter than the drain finger manifolds.

FIGS. 4(a) and 4(b) depict reduced-length bond pads 40, according to embodiments of the present invention. FIG. 4(a) depicts the case of two (or more) transistors 18a, 18b formed on a single semiconductor die 26, which is mounted on a substrate 30. FIG. 4(b) depicts the case of each transistor 18a, 18b being formed on a separate semiconductor die 27, 28, both of which are mounted on the substrate 30. In both cases, the transistor 18a, 18b outputs are connected to an impedance inverter 22 formed on the substrate 30, via a plurality of bond wires 38. The bond wires 38 connect, on the die 26, or dice 27, 28, to reduced-length bond pads 40. That is, the bond pads 40 extend along their respective output manifolds 34 less than the full length of the manifolds 34. The specific length of the bond pads 40 may be varied for each specific implementation, to control the parasitic capacitances they generate and contribute to the quarter-wave transmission line of the impedance inverter 22. The lower limit of the bond pad 40 length is determined by the desired capacitance, as well as by ensuring enough area to bond a sufficient number of bond wires 38 to carry the output current. FIGS. 4(a) and 4(b) additionally show a bond wire 38 connecting the bond pad 40 of the transistor 18a to a bonding pad 42 electrically connected to another circuit formed on the substrate 30.

Prior art concerns about the phase misalignment of output signals from different drain fingers 32 are largely moot with state of the art circuit feature sizes, and at GHz frequencies. For example, a bond pad 40 according to embodiments of the present invention is on the order of 1 mm; at 2 GHz, the wavelength is 150 mm. Hence, changes in the electrical length due to the bond pad 40 do not have appreciable effect on the signal phases.

FIGS. 4(a) and 4(b) depict the bond pads 40 aligned with the outer edges of the corresponding manifolds 34, as may be appropriate to accommodate a long impedance inverter circuit 22. However, the size and position of the bond pads 40 in FIGS. 4(a) and 4(b) are not limiting. For example, FIGS. 5(a)-(d) depict other representative sizes and placements of bond pads 40, at least one of which extends less than the full length of the corresponding manifold 34.

Figure 5A:
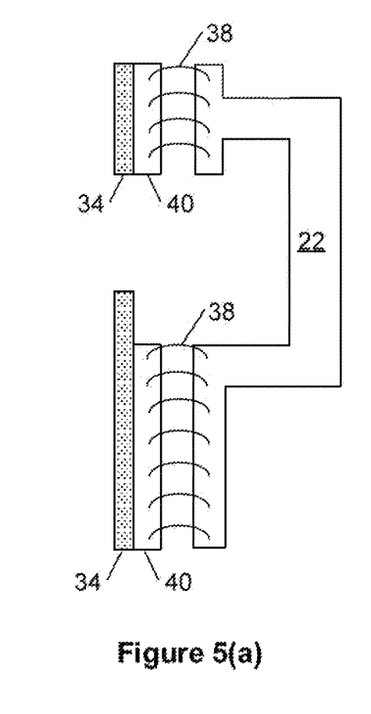
FIGS. 5(a), 5(b), 5(c), and 5(d) are diagrams depicting various lengths and placements of bond pads along respective manifolds.

FIG. 5(a) depicts a bond pad 40 on the first (upper) transistor that extends the full length of the corresponding manifold 34—only the bond pad 40 on the second (lower) transistor is less than the length of the corresponding manifold 34. Such an arrangement may be appropriate where only a slight reduction in parasitic capacitance is required, and/or a large bond pad 40 area is required to support a given number of wire bonds 38 to the first transistor.

Figure 5B:
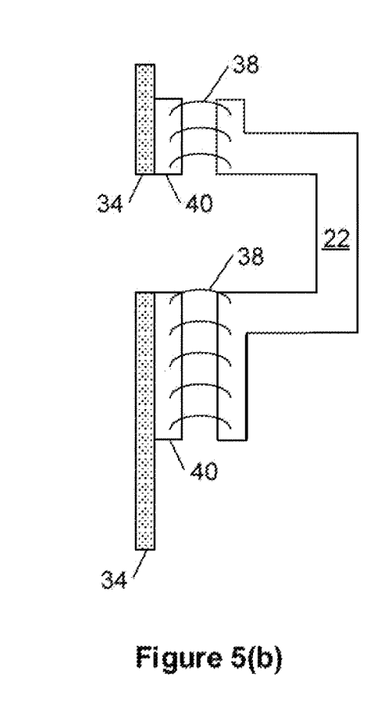

In FIG. 5(b), both bond pads 40 are shorter than their respective manifolds 34. In this embodiment, the bond pads 40 are both positioned toward the center, minimizing the length of the impedance inverter 22. Additionally, the bond pad 40 on the second (lower) transistor is considerably shorter than the corresponding bond pad 40 depicted in FIG. 5(a)—reflecting, in this embodiment, a greater need to reduce the parasitic capacitance presented to the impedance inverter 22.

Figure 5C:
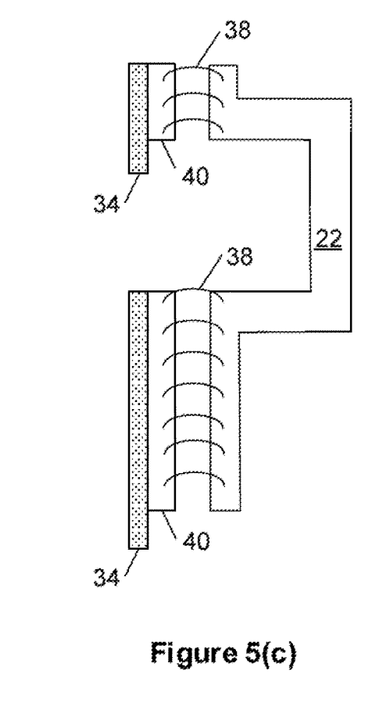

In FIG. 5(c), both bond pads 40 are aligned with the tops of the respective manifolds 34, and the bond pad 40 of the second transistor extends more nearly the full length of the corresponding manifold 34.

Figure 5D:
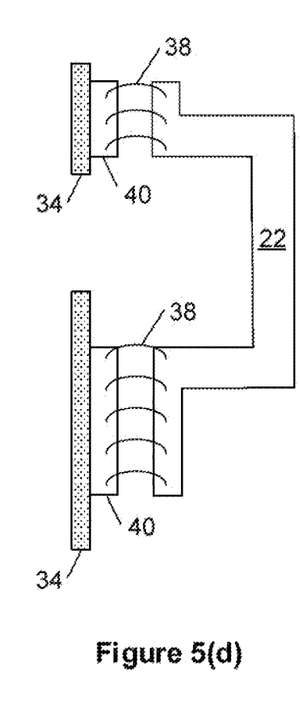

In FIG. 5(d), both bond pads 40 are positioned at the center of the respective manifolds 34. This minimizes the maximum electrical length (and hence any potential phase shift) of transistor output signals on the furthest drain fingers from the bond pad 40.

In general, according to embodiments of the present invention, at least one bond pad 40 may assume any length that is less than the respective manifold 34, and may be placed at any position along the length of the manifold. The length of the bond pad 40 is determined to achieve a required or desired capacitance, such as to optimize the broadband performance of the amplifier 10.

Figure 6:
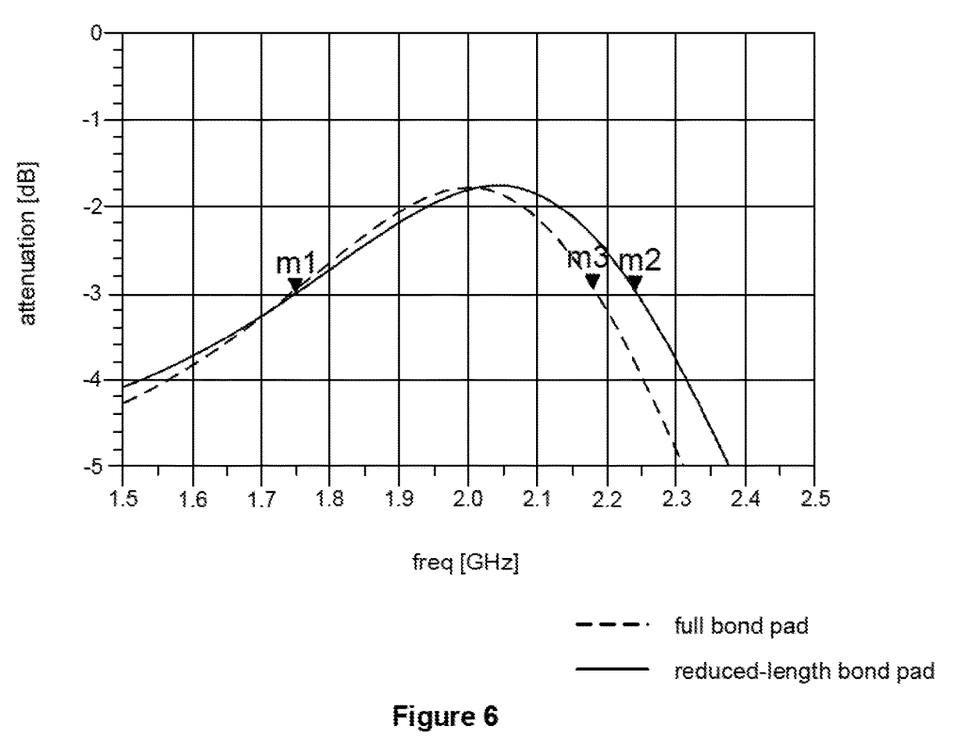
FIG. 6 is a graph of simulate frequency response for amplifiers using conventional bond pads and shortened bond pads according to embodiments of the present invention.

FIG. 6 depicts a graph of the simulated frequency responses for comparable Doherty amplifiers having conventional bond pads 36 extending the full length of respective manifolds 34 (dashed curve), and bond pads 40 according to embodiments of the present invention, wherein the length of each bond pad 40 is adjusted to be less than the length of the corresponding manifold, to optimize its parasitic capacitance contribution (solid curve). The curves exhibit a similar 3 dB point on the lower end, where m1=−3.005 dB at 1.750 GHz. At the higher frequencies, however, the conventional bond pad 36 lengths yield m3=−2.947 dB at 2.180 GHz, while the inventive shortened bond pads 40, the lengths of which were optimized based on their capacitance, yield point m2=−2.971 dB at 2.240 GHz. Optimizing the bond pad 40 length thus improved the 3 dB bandwidth from 430 MHz to 490 MHz—an increase of ~14%.

Figure 7:
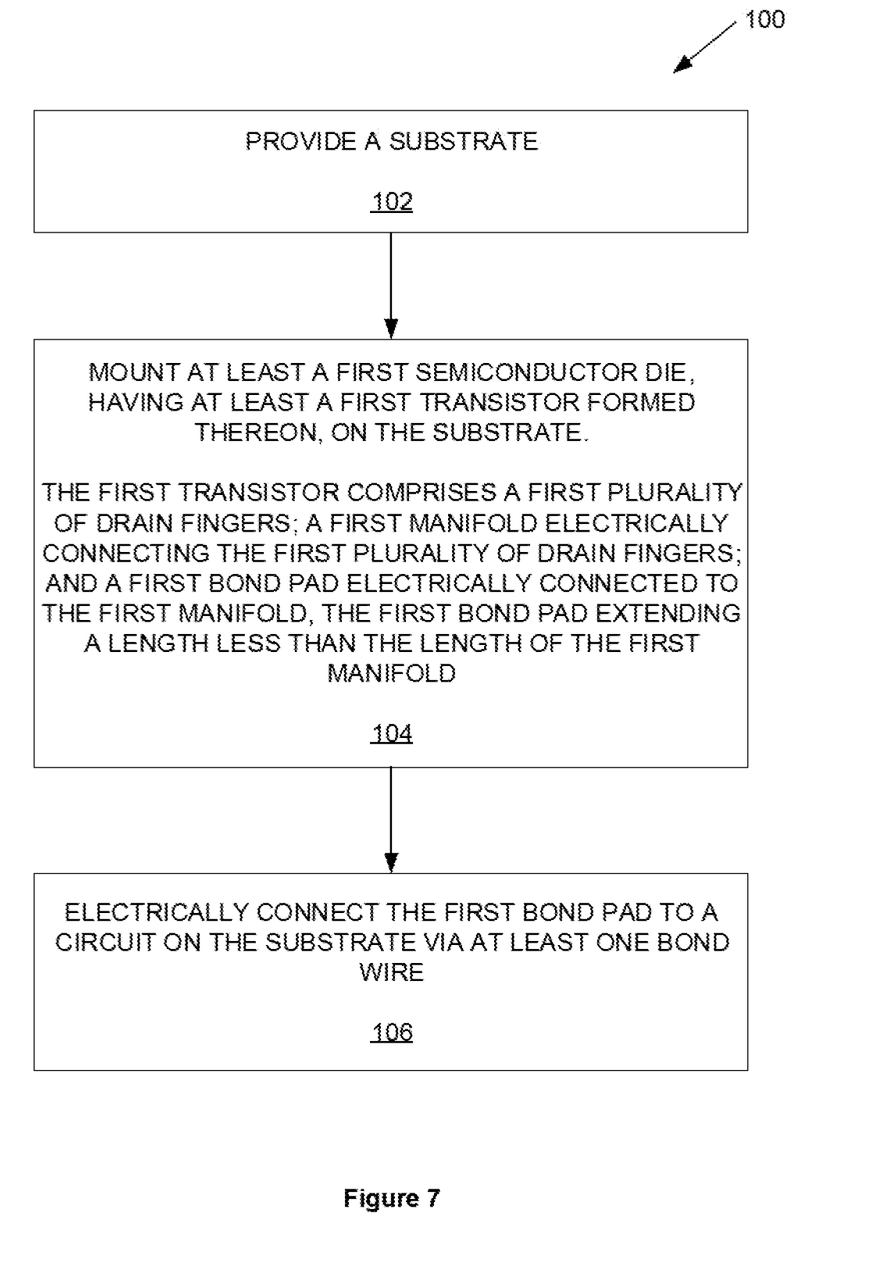
FIG. 7 is a flow diagram of a method of manufacturing an amplifier.

FIG. 7 depicts the steps in a method 100 of manufacturing an amplifier. A substrate is provided (block 102). At least a first semiconductor die is mounted on the substrate (block 104). The first semiconductor die has at least a first transistor formed thereon. The first transistor comprises a first plurality of drain fingers; a first manifold electrically connecting the first plurality of drain fingers; and a first bond pad electrically connected to the first manifold. The first bond pad extends a length less than the length of the first manifold. The first bond pad is electrically connected to a circuit on the substrate via at least one bond wire (block 106).

Embodiments of the present invention may be advantageously employed in any amplifier application where one or more transistor outputs are wirebonded to a substrate in a package, and where control of parasitic capacitance is advantageous. Embodiments are particularly well suited to Doherty amplifier configurations in such packaging, as the parasitic capacitance is incorporated into the, e.g., quarter-wave transmission line of an impedance inverter, and directly affects the amplifier operational characteristics, such as its bandwidth. As such, embodiments of the present invention are particularly well suited for wireless communication applications, such as massive MIMO (mMIMO) multi-chip module (MCM) power amplifiers and macro driver power amplifiers.

Embodiments of the present invention present significant advantages over the prior art. By engineering the length of a bond pad, at a length less than the full extent of a corresponding drain finger manifold, to achieve a required or desired capacitance, the operation of the impedance inverter is optimized, improving the wideband performance of a Doherty amplifier. At high frequency and small feature size, the phase mismatch in output signals from different drain fingers, having different electrical lengths from the drain finger to a bond wire, is negligible.

The term "directly electrically connected" or "electrically connected" or simply "connected" describes a permanent low-ohmic connection between electrically connected elements, for example a wire connection between the concerned elements. Although such a connection may have parasitic effects, such as the parasitic inductance of a bond wire, no component or element is interposed between the connected elements. By contrast, the term "electrically coupled" or simply "coupled" means that one or more intervening element(s) or components, configured to influence the electrical signal in some tangible way, may be (but is not necessarily) provided between the electrically coupled elements. These intervening elements may include active elements, such as transistors or switches, as well as passive elements, such as inductors, capacitors, diodes, resistors, etc.

Spatially relative terms such as "under," "below," "lower," "over," "upper" and the like, are used for ease of description to explain the positioning of one element relative to another element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an", and "the" are intended to include the plural as well as the singular, unless the context clearly indicates otherwise.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A Doherty amplifier, comprising:
   a substrate;
   at least a first semiconductor die mounted on the substrate;
   a main transistor formed on the first semiconductor die, comprising
     a first plurality of drain fingers;
     a first manifold electrically connecting the first plurality of drain fingers; and
     a first bond pad electrically connected to the first manifold; and
   a peak transistor, comprising
     a second plurality of drain fingers;
     a second manifold electrically connecting the second plurality of drain fingers; and
     a second bond pad electrically connected to the second manifold; and
   an impedance inverter connecting outputs of the main and peak transistors, the impedance inverter comprising parasitic capacitances of the first and second bond pads;
   wherein at least one of the first and second bond pads extends a length less than the length of the respective first or second manifold, so as to alter an electrical length of the impedance inverter by reducing the parasitic capacitance.

2. The Doherty amplifier of claim 1 wherein the main and peak transistors are formed on the same first semiconductor die.

3. The Doherty amplifier of claim 1 further comprising a second semiconductor die mounted on the substrate, and wherein the peak transistor is formed on the second semiconductor die.

4. The Doherty amplifier of claim 1 wherein the impedance inverter is connected via bond wires to the first and second bond pads.

5. The Doherty amplifier of claim 1 wherein altering the electrical length of the impedance inverter improves the broadband performance of the Doherty amplifier.

6. A method of manufacturing a Doherty amplifier, comprising:
   providing a substrate;
   mounting at least a first semiconductor die on the substrate, the first semiconductor die having a main transistor formed thereon, the main transistor comprising
     a first plurality of drain fingers;
     a first manifold electrically connecting the first plurality of drain fingers; and a first bond pad electrically connected to the first manifold;

forming a peak transistor, comprising
a second plurality of drain fingers;
a second manifold electrically connecting the second plurality of drain fingers; and
a second bond pad electrically connected to the second manifold; and connecting an impedance inverter to outputs of the main and peak transistors, the impedance inverter comprising parasitic capacitances of the first and second bond pads;

wherein at least one of the first and second bond pads extends a length less than the length of the respective first or second manifold, so as to alter an electrical length of the impedance inverter by reducing the parasitic capacitance.

7. The method of claim 6, wherein forming a peak transistor comprises forming the peak transistor on the first semiconductor die.

8. The method of claim 6, wherein forming a peak transistor comprises mounting a second semiconductor die on the substrate and forming the peak transistor on the second semiconductor die.

9. The method of claim 6 further comprising:
placing an impedance inverter on the substrate; and
wherein connecting the impedance inverter to outputs of the main and peak transistors comprises connecting the impedance inverter via bond wires to the first and second bond pad.

10. The method of claim 6 wherein altering the electrical length of the impedance inverter improves the broadband performance of the Doherty amplifier.

11. The Doherty amplifier of claim 1 further comprising:
at least one bond wire electrically connecting the first bond pad to a circuit on the substrate.

12. The method of claim 6 further comprising:
electrically connecting the first bond pad to a circuit on the substrate via at least one bond wire.

* * * * *